United States Patent
Vincent et al.

(10) Patent No.: US 9,799,636 B2
(45) Date of Patent: Oct. 24, 2017

(54) PACKAGED DEVICES WITH MULTIPLE PLANES OF EMBEDDED ELECTRONIC DEVICES

(71) Applicant: FREESCALE SEMICONDUCTOR, INC., Austin, TX (US)

(72) Inventors: Michael B. Vincent, Chandler, AZ (US); Zhiwei Gong, Chandler, AZ (US); Scott M. Hayes, Chandler, AZ (US)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 14/939,981

(22) Filed: Nov. 12, 2015

(65) Prior Publication Data

US 2017/0141087 A1    May 18, 2017

(51) Int. Cl.
*H01L 25/00* (2006.01)
*H01L 25/10* (2006.01)

(52) U.S. Cl.
CPC ............ *H01L 25/105* (2013.01); *H01L 25/50* (2013.01); *H01L 2225/1088* (2013.01)

(58) Field of Classification Search
CPC .................................................... H01L 25/105
See application file for complete search history.

(56) References Cited

U.S. PATENT DOCUMENTS

| | | | |
|---|---|---|---|
| 7,687,899 B1 | 3/2010 | Berry | |
| 8,216,918 B2 | 7/2012 | Gong et al. | |
| 8,304,878 B2 | 11/2012 | Appelt | |
| 8,518,746 B2 | 8/2013 | Pagaila et al. | |
| 9,142,502 B2 | 9/2015 | Gong et al. | |
| 2003/0148552 A1* | 8/2003 | Halahan | H01L 23/13 438/106 |
| 2007/0114648 A1 | 5/2007 | Karnezos | |
| 2009/0146283 A1* | 6/2009 | Chen | H01L 25/0657 257/686 |
| 2010/0072634 A1 | 3/2010 | Ha et al. | |
| 2010/0087034 A1* | 4/2010 | Yoo | H01L 25/16 438/108 |
| 2010/0289126 A1 | 11/2010 | Pagaila et al. | |
| 2011/0068459 A1 | 3/2011 | Pagaila et al. | |
| 2012/0056329 A1* | 3/2012 | Pagaila | H01L 21/56 257/774 |

(Continued)

OTHER PUBLICATIONS

U.S. Appl. No. 15/195,175, filed Jun. 28, 2016.

(Continued)

*Primary Examiner* — William Harriston

(57) ABSTRACT

A packaged semiconductor structure includes an interconnect layer and a first microelectronic device on a first major surface of the interconnect layer. The structure also includes a substrate having a cavity, wherein the cavity is defined by a vertical portion and a horizontal portion, wherein the vertical portion surrounds the first device, the horizontal portion is over the first device, and the first device is between the horizontal portion and the first major surface of the interconnect layer such that the first device is in the cavity. The structure further includes a second microelectronic device attached to the horizontal portion of the substrate, and encapsulant on the interconnect layer and surrounding the first device, the substrate, and the second device, such that the substrate is embedded in the encapsulant.

7 Claims, 11 Drawing Sheets

(56) References Cited

U.S. PATENT DOCUMENTS

| | | |
|---|---|---|
| 2013/0037936 A1 | 2/2013 | Choi et al. |
| 2013/0049217 A1 | 2/2013 | Gong et al. |
| 2013/0154091 A1* | 6/2013 | Wright .............. H01L 23/49816 257/738 |
| 2013/0175686 A1 | 7/2013 | Meyer et al. |
| 2014/0057394 A1 | 2/2014 | Ramasamy et al. |
| 2014/0159251 A1 | 6/2014 | Marimuthu et al. |
| 2015/0155240 A1 | 6/2015 | Yao et al. |
| 2015/0262931 A1 | 9/2015 | Vincent et al. |

OTHER PUBLICATIONS

Narveson, B., et al., "Significant Developments and Trends in 3D Packaging with Focus on Embedded Substrate Technologies", PSMA Packaging Committee, 2015.
Non-final office action dated Apr. 21, 2017 in U.S. Appl. No. 15/195,175.
Notice of Allowance dated Jun. 21, 2017 in U.S. Appl. No. 15/195,175.
Notice of Allowance dated Aug. 2, 2017 in U.S. Appl. No. 15/195,175.

\* cited by examiner

PACKAGED DEVICES WITH MULTIPLE PLANES OF EMBEDDED ELECTRONIC DEVICES

BACKGROUND

Field

This disclosure relates generally to electronic device packaging, and more specifically, to fanout wafer level packaging of electronic devices.

Related Art

Fanout wafer level packaging (FO-WLP) processes typically entail the formation of redistribution layers over the surface of a die package, which includes a molded package body in which one or more microelectronic devices are embedded. For example, FO-WLP processes may be used to produce System-in-Package (SiP) types of device, in which multiple microelectronic devices, such as semiconductor die carrying ICs, micro-electromechanical systems (MEMS), optical devices, passive electronic components, and the like, are embedded in a single package that is both compact and structurally robust.

In a FO-WLP device, the redistribution layers provide electrical interconnection between contact pads located on the embedded microelectronic devices and a contact array, such as a ball grid array, formed over a surface of the completed FO-WLP package. In this manner, the redistribution layers allow the contact pads to have a relatively tight pad-to-pad spacing or pitch, while still providing a comparably large surface area over which the contact array can be distributed or fanned-out. To produce the redistribution layers, one or more layers of dielectric or passivation material are initially deposited over the embedded microelectronic components and cover the contact pads. In one conventional approach, a separate via is etched through the dielectric layer to expose a portion of each contact pad, metal plugs or other conductors are then formed in each via to provide ohmic contact with the contact pad, and then a circuit or interconnect line is formed in contact with each conductor.

Conventional FO-WLP devices include only a single plane of microelectronic devices embedded inside the molded package body. Accordingly, given miniaturization limits on the microelectronic components, increasing the number or complexity of the embedded components results in an increase in the FO-WLP device footprint. With the ever-present desire to reduce, rather than increase, device footprints, it is desirable for there to be further improvement in the device density in FO-WLP devices.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The figures are not necessarily drawn to scale.

DETAILED DESCRIPTION

Embodiments of a fanout wafer level packaged (FO-WLP) device, include a substrate with cavity (SwC) structure, and one or more microelectronic devices positioned within the cavity. The SwC includes vertical portions and horizontal portion(s), which define sidewalls and horizontal, which may be referenced as the bottom, surface(s) of the cavity, respectively. One or more additional microelectronic devices may be coupled to the horizontal portion(s) of the SwC which may be to the horizontal surface(s) that define the bottom surface(s) of the cavity, and/or to horizontal surface(s) on the opposite side of the bottom surface(s) of the cavity. The SwC and the microelectronic devices are embedded in molding compound. The FO-WLP device also includes a redistribution layer formed over the molding compound and over exposed contact pads of at least some of the microelectronic devices. The redistribution layer, which is a build-up of alternating dielectric and metal layers interconnected by vias, distributes or fans out electrical connections between the contact pads of the embedded microelectronic devices and externally-accessible contact pads on an external bottom surface of the FO-WLP device which may be an external surface of the redistribution layer. Solder interconnects, which may be solder balls, applied to the externally-accessible contact pads provide a means to interconnect the FO-WLP package to a printed circuit board (PCB). The SwC also may include embedded, conductive, through substrate vias (TSVs), which may be filled or pre-placed vias, that extend through the SwC's vertical portions. The TSVs enable one or more additional packaged or unpackaged microelectronic devices to be physically and electrically connected to the top" surface of the FO-WLP device which in this case is the surface that is opposite the bottom surface. The embedded TSVs through the SwC enable the microelectronic device(s) on the top surface of the FO-WLP device to be electrically connected through the SwC and the redistribution layer to the bottom surface of the FO-WLP device. This is better understood by reference to the drawings and the following written description.

The following detailed description is merely exemplary in nature and is not intended to limit the invention or the application and uses of the invention. Furthermore, there is no intention to be bound by any expressed or implied theory presented in the preceding technical field, background, brief summary or the following detailed description. In some examples, the signal conduit for passing a signal from one side of the device package to another is described as a conductive via or pillar. It should be recognized that such examples are not intended to limit embodiments of the present invention to electrically conductive materials, as the signal conduit can include additional materials such as waveguide for passing optical signals.

Figure 1:
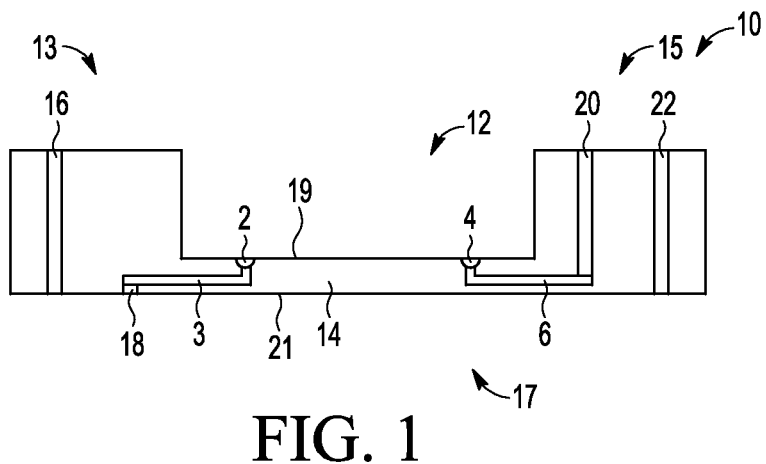
FIGS. 1-10 are cross sections of an embodiment of a structure at various stages in a processing sequence.

FIGS. 1-10 are cross sections of an embodiment of a structure at various stages in a processing sequence. Shown in FIG. 1 is a cross-section of a substrate with cavity (SwC) structure 10 having a cavity 12 in a substrate 14. Generally, the body of the substrate 14 is formed from a non-conductive material. Substrate 14 includes a vertical portion 13 and a vertical portion 15 which are shown on the left and right sides of FIG. 1 and a horizontal portion 17 which is shown on the bottom of FIG. 1 and extending between the vertical portions 13 and 15. The body of the substrate 14 has two additional vertical portions not shown in this cross section so that four vertical portions surround the cavity 12. If viewed from the top, the cavity 12 would have a square or rectangular shape defined by four sidewalls and a bottom surface. Shown on one side of cavity 12 is a conductive via 16 through first vertical portion 13, and on an opposing side are two additional conductive vias 20 and 22 through second vertical portion 15, with via 20 being adjacent to cavity 12. All vias described herein are conductive whether explicitly characterized as conductive or not. Further conductive vias may be present through the vertical portions of cavity 12 not shown in FIG. 1. Vias 16 and 22, as shown, pass through substrate 14 and thus may be considered conductive through substrate vias (TSVs). Via 20 extends from the top surface of substrate 14 only partially through the substrate 14. The opposing surfaces of cavity 12 may be referenced as vertical surfaces or sidewalls, and the surface surrounded by the vertical surfaces may be called a horizontal surface 19 or a bottom surface 19 of cavity 12. Horizontal portion 17 of the substrate 14 defines the horizontal surface of the cavity 12. In addition, the substrate 14 has a bottom surface 21, which may also be called a horizontal surface 21, on an opposite side of horizontal surface 19 of cavity 12, where the bottom surface of the substrate 14 is defined by horizontal portion 17 and vertical portions 13 and 15 of the substrate 14. Substrate 14 itself has electrical interconnects in the area of cavity 12 which includes contacts such as contacts 2 and 4 on the horizontal surface of the cavity 12 and may have metal traces on horizontal surface 19 of cavity 12. The electrical interconnects also may have one or more interconnect layers below horizontal surface 19 of cavity 12, which may include traces such as interconnect line 6 that connects contact 4 to via 20. Via 20 does not extend all the way through substrate 14 but stops on interconnect line 6. Accordingly, contact 4, interconnect line 6, and via 20 provide electrical connectivity between bottom surface 19 of cavity 12 and the top surface of substrate 14. Another contact 18 is exposed at bottom surface 19 of substrate 14. An interconnect line 3 extends from contact 18 to contact 2 on horizontal surface 19 of cavity 12. Accordingly, contact 2, interconnect line 3, and contact 18 provide electrical connectivity between bottom surface 19 of cavity 12 and bottom surface 21 of the substrate 14.

Figure 2:
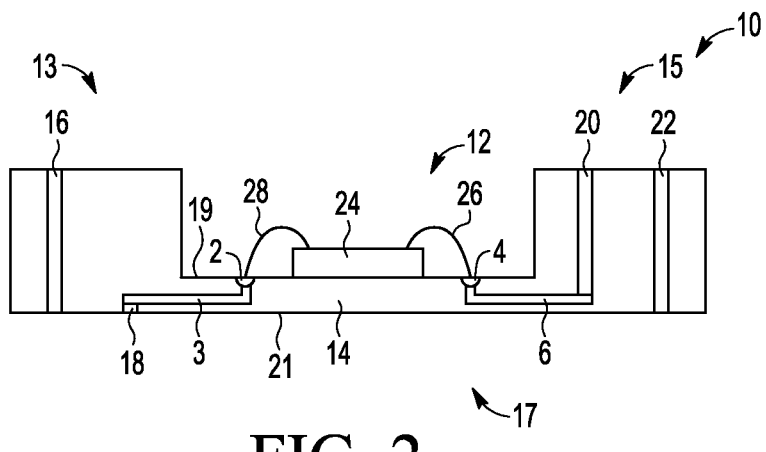

Shown in FIG. 2 is SwC structure 10 after mounting a device 24, which may be an integrated circuit or some other type of microelectronic device, on horizontal surface 19 of cavity 12, connecting a wirebond 26 between a contact pad of device 24 and contact 4, and connecting a wirebond 28 between a contact pad of device 24 and contact 2 on the horizontal surface of cavity 12. Wirebonds 26, 28 are an example of making electrical connection but connection using flip-chip technology or other surface mount technologies could be used. In addition, it should be noted that multiple microelectronic devices could be coupled to horizontal surface 19 of cavity 12. The multiple microelectronic devices could be electrically connected with additional contacts (not shown) in the SwC structure 10 that are exposed at bottom surface 21 of the cavity 12. In addition, the multiple microelectronic device could be electrically interconnected with each other using wirebonds and/or conductive traces in the SwC structure 10.

Figure 3:
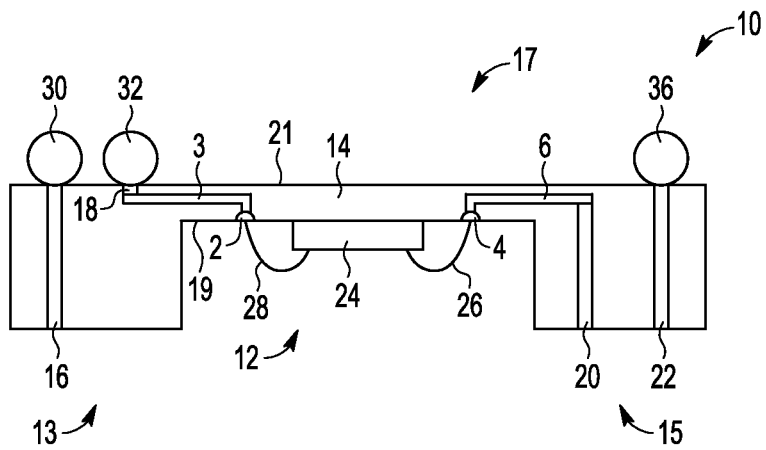

Shown in FIG. 3 is SwC structure 10 after attaching interconnects 30, 32, and 36, which may be solder balls, to via 16, contact 18, and via 22, respectively, on horizontal surface 21 of the substrate 14 that is opposite cavity 12 which is surface 21 of substrate 14 that is opposite bottom surface 19 of cavity 12). It may be beneficial to provide conductive pads between vias 16 and 22 and interconnects 30 and 36, respectively, and between contact 18 and interconnect 32. Note that, although one implementation may use solder balls for interconnects 30, 32, 36, another implementation may use conductive posts or other structures.

Figure 4:
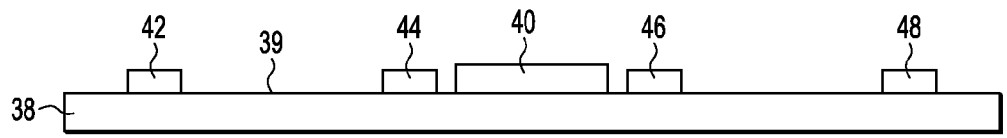

Shown in FIG. 4 is a portion of a temporary carrier 38 that corresponds to a single device area. Temporary carrier 38 has a surface 39, and devices 42, 44, 40, 46, and 48 are non-permanently attached thereto which may be by using non-permanent adhesive or tape. Devices 44, 40, and 46 are spaced relatively close together and near a middle portion of carrier 38. Devices 42 and 48 are near opposing ends of carrier 38. The temporary carrier 38 may be sufficiently sized to enable parallel fabrication of multiple devices simultaneously. However, only a portion of the temporary carrier 38 corresponding to a single device site is shown in FIG. 4 for clarity. The method described herein is applicable to panel level packaging, and what is being shown in FIG. 4 is one package site in an array of sites. The single package site of FIG. 4 is repeated in an array on a larger carrier.

Figure 5:
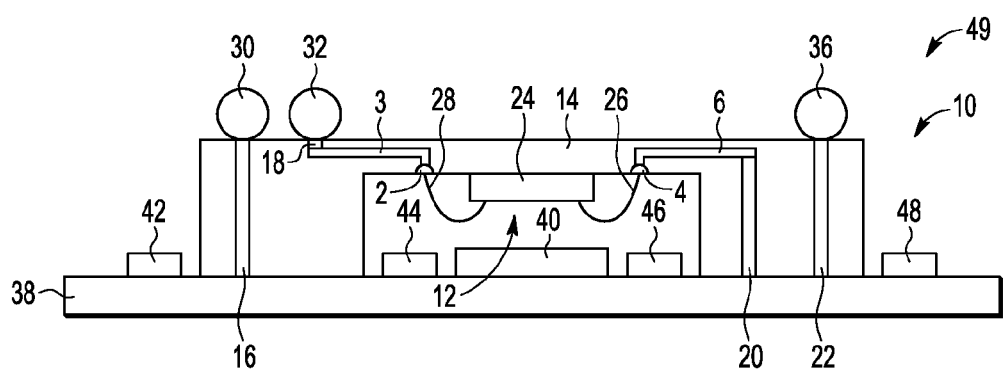

Shown in FIG. 5 is an intermediate structure 49, in which the SwC structure 10 of FIG. 3 is attached to carrier 38 such that devices 44, 40, and 46 are within cavity 12 and devices 42 and 48 are spaced from SwC structure 10.

Figure 6:
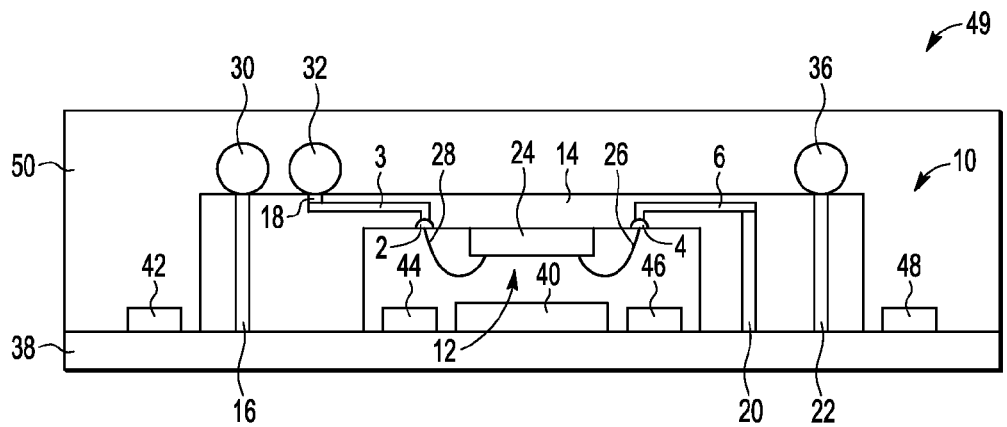

Shown in FIG. 6 is intermediate structure 49 after applying an encapsulant 50 that covers the top surface of carrier 38 and thus covers SwC structure 10, device 42, and device 48. Cavity 12 also is filled with encapsulant 50 in this process by way of the encapsulant flowing through openings (not shown) in the SwC structure 10. This has the effect of encapsulant 50 adhering to and encapsulating devices 24, 44, 40, and 46, along with SWC structure 10.

Figure 7:
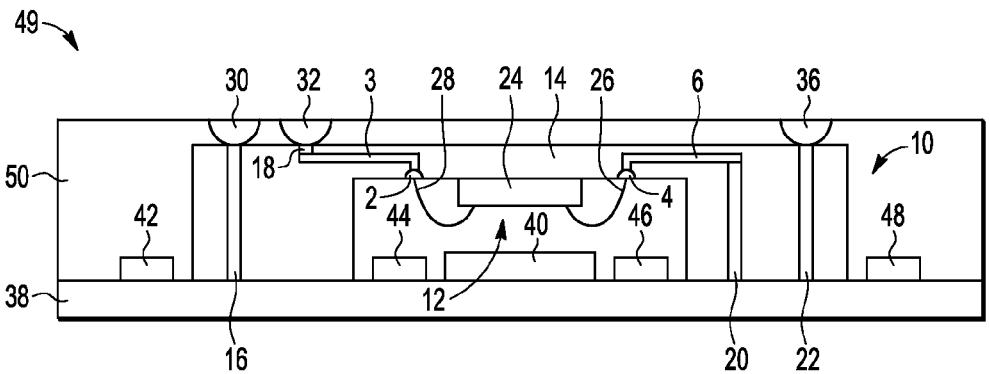

Shown in FIG. 7 is intermediate structure 49 after grinding back encapsulant 50 and stopping after exposing solder interconnects 30, 32, and 36. The grinding also may partially grind back interconnects 30, 32, and 36.

Figure 8:
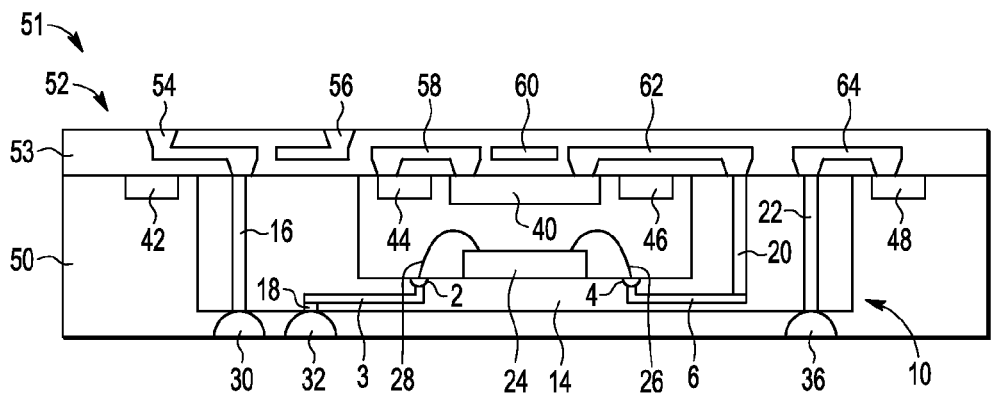

Shown in FIG. 8 is a fanout wafer level package (FO-WLP) 51 arising from removing carrier 38 and forming an interconnect layer 52 where carrier 38 had been present as shown in FIG. 7. Interconnect layer 52 has at least one dielectric layer 53, which has an internal surface contacting the surface of SwC structure 10 where devices 40, 44, and 46, are present. Interconnect layer 52 may be referenced as a redistribution layer. The devices 40, 44, and 46 each may have contact pads that contact the internal surface of the interconnect layer 52, or more particularly conductive structures, further described below, within the interconnect layer 52. Interconnect layer 52 also has an external surface opposite the internal surface, and has interconnects, such as interconnects 54, 56, 58, 60, 62, and 64, formed from portions of one or more conductive layers that are embedded in dielectric layer(s) 53. Devices 42, 48 are not located within the encapsulant-filled cavity 12 of SwC structure 10, but instead are in contact with the surface of the dielectric layer(s) 53 so they can be electrically contacted which is shown with interconnect 64 contacting device 48. The interconnects are for electrically connecting to the vias 16, 20, 22, the devices 40, 42, 44, 46, 48, and the external surface of interconnect layer 52. Although only one interconnect layer is shown, there may be a number of conductive interconnect layers within dielectric layer(s) 53.

Figure 9:
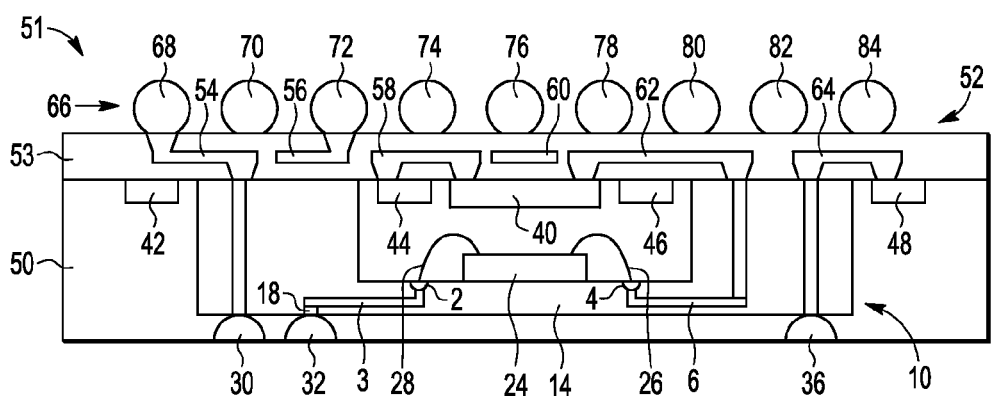

Shown in FIG. 9 is FO-WLP 51 after forming a plurality of solder balls 66, including solder balls 68, 70, 72, 74, 76, 78, 80, 82, and 84. The solder balls provide a highly usable external electrical connection to devices 24, 40, 42, 44, 46, and 48. In a typical application all or nearly all of the solder balls would be electrically connected to an interconnect within the FO-WLP 51. Examples of such connections are solder ball 68 to interconnect 54 and solder ball 72 to interconnect 56. At this stage, packaging may be considered complete so that the FO-WLP 51 is ready for assembly to a printed circuit board. FO-WLP 51 includes two planes of microelectronic devices, with the first plane including device 24, and the second plane including devices 40, 42, 44, 46, 48. As used herein, a "plane of microelectronic devices" is defined as a set of one or more microelectronic devices, each having a surface that is co-planar with a surface of other microelectronic devices, if any, in the set.

Figure 10:
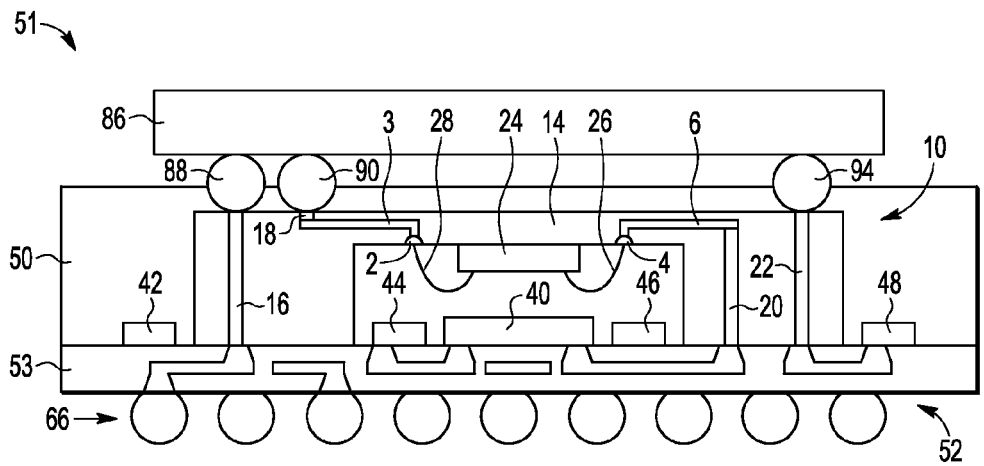

Shown in FIG. 10 is FO-WLP 51 after forming additional solder interconnects 88, 90, and 94 using previously grinded interconnects 30, 32, and 36, respectively, and attaching an additional packaged or unpackaged electronic device 86, which may include an integrated circuit and/or other electronic components, thereto. Alternatively, rather than connecting device 86 to the solder interconnects 88, 90, and 84, the solder interconnects 88, 90, and 94 could be used to connect the FO-WLP 51 to a printed circuit board. Device 24 may be considered to be a third microelectronic device plane.

Figure 11:
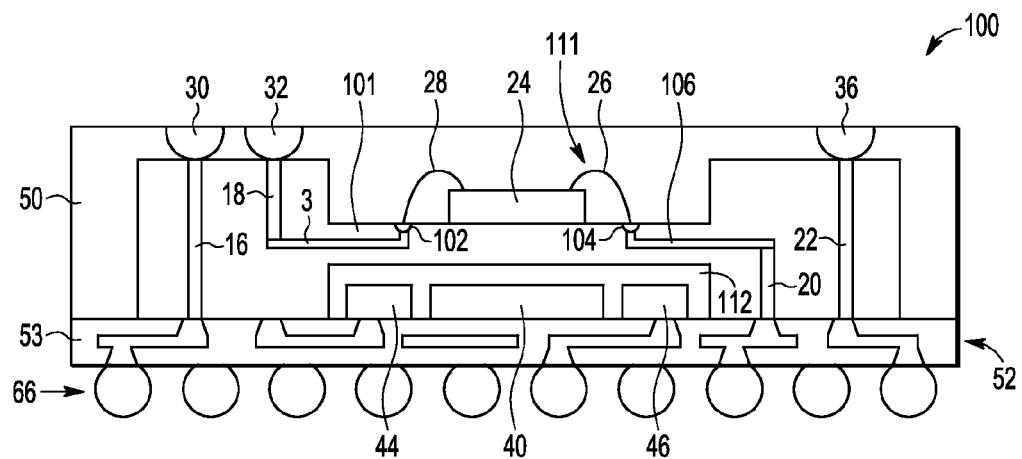
FIG. 11 is a cross section of another embodiment of a structure resulting from using a method similar to that shown in FIGS. 1-10.

Shown in FIG. 11 is a FO-WLP 100 as a variation on FO-WLP 51 retaining the numerals that refer to features common with FO-WLP 51. FO-WLP 100 includes a substrate 101, similar to substrate 14, which has two cavities: a first cavity 111 extending partially through substrate 14 from a first substrate surface, and containing device 24; and a second cavity 112 extending partially through substrate 14 from a second substrate surface, and containing devices 40, 44, and 46. In this case cavity 111 is on the opposite side of the horizontal portion of substrate 101 from cavity 112. During fabrication of an embodiment of a FO-WLP, there are situations where it may be advantageous to have access to the location where device 24 is present prior to encapsulation. As shown in FIG. 5, when device 24 is coupled to the substrate 14, and the substrate 14 is flipped over and coupled to the temporary carrier 38, device 24 is not easily accessible even though encapsulation has not yet occurred. In contrast, in the embodiment of FIG. 11, even after the substrate 101 is coupled to the temporary carrier, cavity 111 may be open and upward facing prior to encapsulation. For example, cavity 112 instead may be facing the temporary carrier 38. Accordingly, device 24 may be accessible when the substrate 101 is coupled to the temporary carrier.

Figure 12:
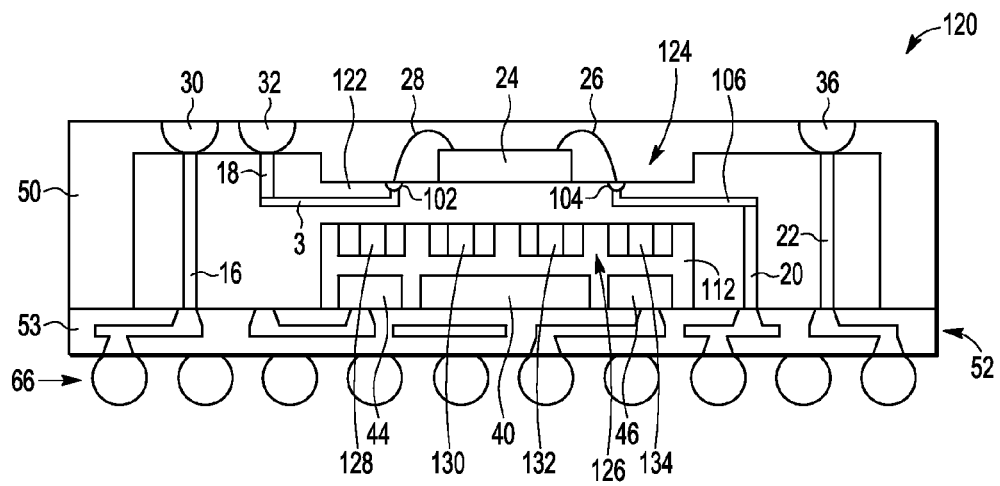
FIG. 12 is a cross section of yet another embodiment of a structure resulting from using a method similar to that shown in FIGS. 1-10.

Shown in FIG. 12 is a FO-WLP 120 as a variation on FO-WLP 100 which has a cavity 124 in the location of cavity 111 but, as shown, cavity 124 is shallower than cavity 111. More specifically, whereas cavity 111, shown in FIG. 11, is deep enough so that device 24 and wirebonds 26, 28 do not protrude outside of cavity 111, cavity 124, shown in FIG. 12, is shallower so that device 24 and/or wirebonds 26, 28 do protrude outside of cavity 124. In addition, the substrate of FO-WLP 120 has a cavity 126 in the location of cavity 112 that is deeper than cavity 112, shown in FIG. 11. Deeper cavity 126 allows for multiple planes of devices to be included in the cavity 126. More specifically, a first plane of microelectronic devices, including devices 128, 130, 132, and 134, is coupled in cavity 126 to an opposite surface of the horizontal portion of the substrate from the surface to which device 24 is coupled. Device 24 forms a portion of a third plane of microelectronic devices within FO-WLP 120. In addition, a second plane of microelectronic devices, including devices 40, 44, 46, is fixed by encapsulant 50 within cavity 126. As shown, devices 128, 130, 132, 134 are surface mount devices, which may not need to be wirebonded to contacts within the substrate to provide for electrical connection to the substrate, but that possibility is not precluded. The embodiment of FIG. 12 shows that wire bonds (e.g., wirebonds 26, 28) can extend outside a cavity, such as cavity 124, and the device 24 may still be successfully encapsulated. Alternatively, as a variation, the substrate of FO-WLP 120 can be made with the same upper cavity 124, but with increased substrate thickness allowing for an even deeper lower cavity 112.

Figure 13:
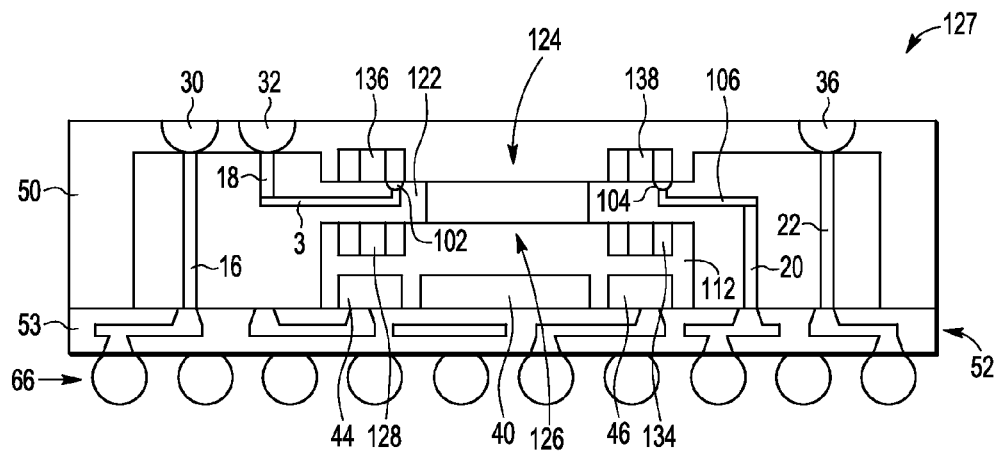
FIG. 13 is a cross section of yet another embodiment of a structure resulting from using a method similar to that shown in FIGS. 1-10.

Shown in FIG. 13 is a FO-WLP 127 as a variation on FO-WLP 120 by having surface mount microelectronic devices 128, 134, 136, 138 (e.g., passive devices and/or other types of devices) on opposite surfaces of horizontal portions of the substrate in both cavity 124 and 126, instead of including a wire bonded device in cavity 124 (e.g., as was shown in FIG. 12). In this case devices 136 and 138 are positioned on horizontal portions of the substrate in cavity 124, and devices 128 and 134 are positioned on horizontal portions of the substrate in cavity 126. In the embodiment of FIG. 13, an opening in the horizontal portion of the substrate between devices 136 and 138 connects the two cavities 124, 126. The presence of the opening yields two horizontal portions of the substrate, horizontal portions on opposite sides of the opening, or alternatively a single horizontal portion in the form of a shelf around the perimeter of the cavities 124, 126. Also, the devices may be surface mount devices, which may be passive devices or other surface mount devices or may be wire bonded devices, and they can be either in cavity 124 or in cavity 126. The result is there is an upper cavity 124 with a first plane of devices mounted to first surfaces of the horizontal portion of the substrate, a lower cavity 126 with a second plane of devices mounted to second surfaces of the horizontal portion of the substrate, and a third plane of devices within the lower cavity 126 and in contact with interconnect layer 52.

Figure 14:
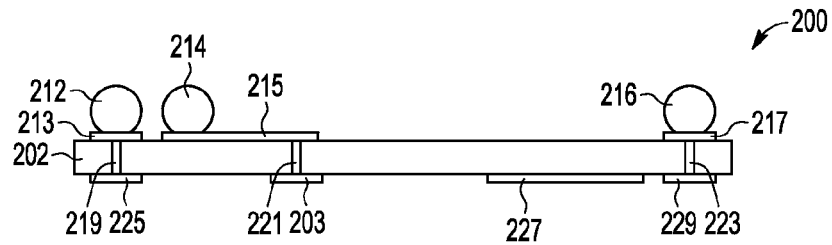
FIGS. 14-24 are cross sections of yet another embodiment of a structure at various stages in a processing sequence.

FIGS. 14-24 are cross sections of another embodiment of a structure at various stages in a processing sequence. Shown in FIG. 14 is a structure 200 including a substrate 202; conductive vias 219, 221, and 223 through substrate 202; conductive pads 213, 215, and 217 on vias 219, 221, and 223, respectively; conductive interconnects (e.g., solder balls or conductive posts) 212, 214, and 216 mounted on conductive pads 213, 215, and 217, respectively, on a first major surface of substrate 202; conductive pads 225, 203, and 229 on vias 219, 221, and 223, respectively, on a second major surface of substrate 202; and a conductive pad 227 on the second major surface near conductive pad 229. Structure 200 may be considered to be an interposer layer. Vias 219 and 221 are an adjacent pair near one end of substrate 202, and via 223 is near an opposite end of substrate 202.

Conductive pad 227 functions as a trace. Conductive pad 215 functions as both a pad and a trace.

Figure 15:
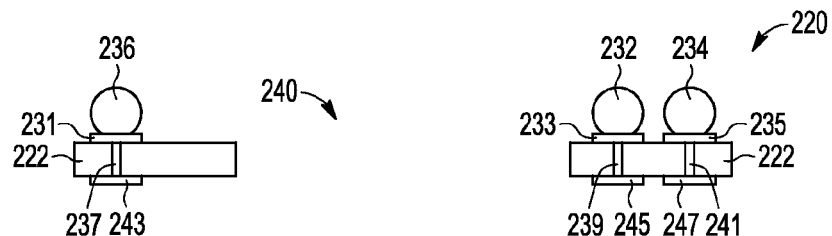

Shown in FIG. 15 is a structure 220 including a substrate 222; conductive vias 237, 239, and 241 through substrate 222; conductive pads 231, 233, and 235 on vias 237, 239, and 241, respectively, on a first major surface of substrate 222; solder balls 236, 232, and 234 on conductive pads 231, 233, and 235, respectively; and conductive pads 243, 245, and 247 on vias 237, 239, and 241, respectively, on a second major surface of substrate 222. Structure 220 may be considered to be an interposer layer which is analogous to the horizontal portion of substrates previously described in conjunction with FIGS. 1-13. Vias 239 and 241 are an adjacent pair near one end of substrate 222, and via 237 is near an opposite end of substrate 222. The adjacent pair of vias 239 and 241 is separated from via 237 by an opening 240 in substrate 222. As used herein, an opening is considered to be a type of cavity. An opening in a material may be viewed as a cavity that extends completely through the material.

Figure 16:
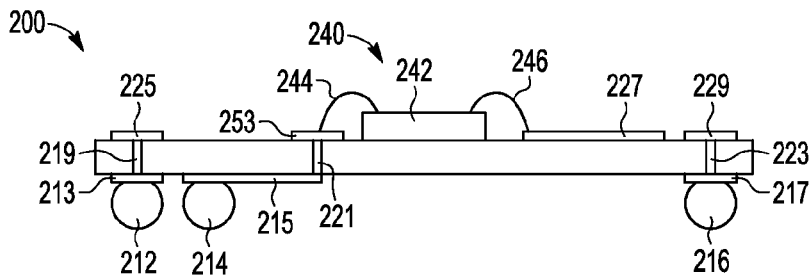

Shown in FIG. 16 is structure 200, inverted from the orientation shown in FIG. 14, after mounting a device 242, which may be an integrated circuit or some other type of microelectronic device, on the second major surface of structure 200 between conductive pads 253 and 227. Also shown is structure 200 after connecting a first wirebond 244 between a first contact pad on an upper surface of device 242 and conductive pad 253 and connecting a second wirebond 246 between a second contact pad on an upper surface of device 242 and conductive pad 227.

Figure 17:
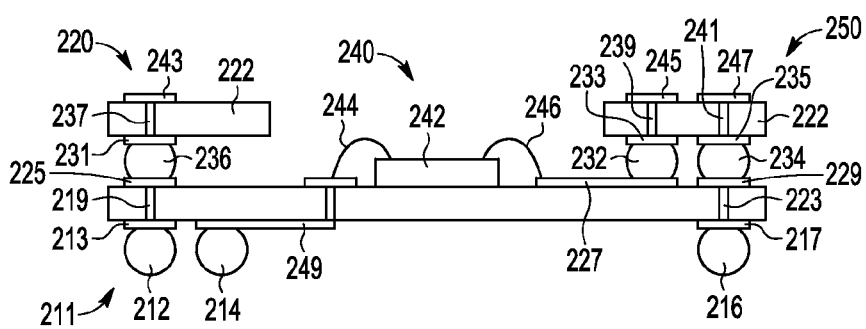

Shown in FIG. 17 is the combination of structures 200 and 220 to result in a similar structure to SWC structure 10 of FIG. 3 in which structures 200 and 220 are connected together with solder balls 236, 232, and 234, although conductive posts or other conductive structures alternatively could be used. Solder ball 236 is connected between conductive pads 231 and 225. Solder ball 232 is connected between conductive pads 233 and 227. Solder ball 234 is connected between conductive pads 235 and 229. Opening 240 results in a cavity around device 242 that is similar to cavity 12 of SwC structure 10. Wirebonds 244 and 246 extend into opening 240, although wirebonds 244 and 246 alternatively may have insufficient height to cause them to extend into opening 240, as well. The result of combining structure 200 and 220 as shown in FIG. 17 is herein referenced as SwC structure 250.

Figure 18:
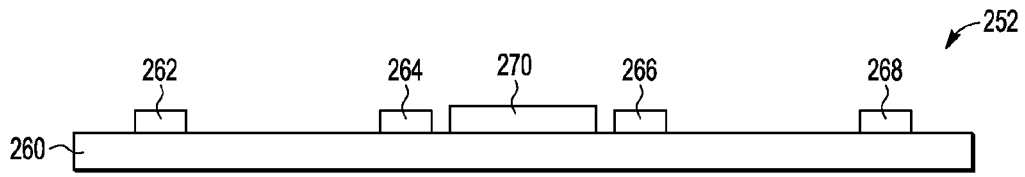

Shown in FIG. 18 is portion of a temporary carrier 260, which is substantially similar to carrier 38 of FIG. 4, that corresponds to a single device area. The temporary carrier 260 has a surface, and devices 262, 264, 266, 268, and 270 non-permanently attached thereto (e.g., using non-permanent adhesive or tape). Devices 264, 266, 270 are spaced relatively close together and near a middle area of the portion of carrier 260. Devices 262 and 268 are near opposing ends of the portion of carrier 260. The temporary carrier 260 may be sufficiently sized to enable parallel fabrication of multiple devices simultaneously. However, only a portion of the temporary carrier 260 corresponding to a single device site is shown in FIG. 18 for clarity. The method described herein is applicable to panel level packaging, and what is being shown in FIG. 18 is one package site in an array of sites. The single package site of FIG. 18 is repeated in an array on a larger carrier.

Figure 19:
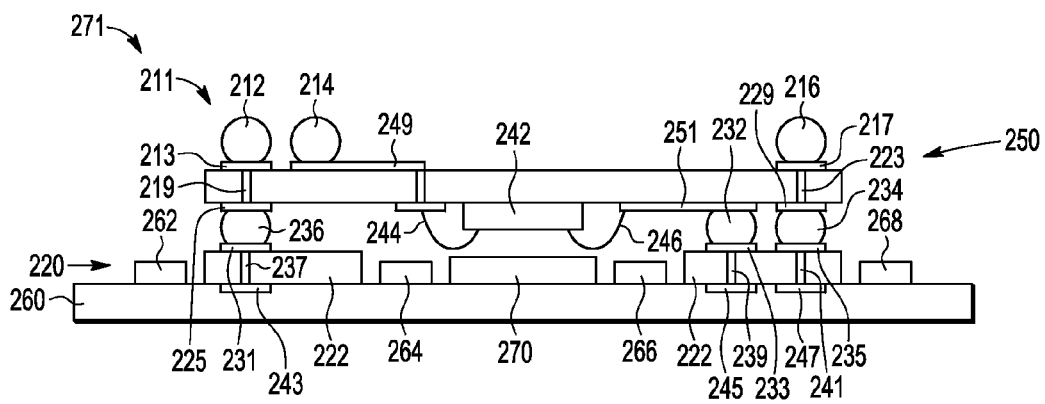

Shown in FIG. 19 is an intermediate structure 271 formed from SwC structure 250 of FIG. 17, shown as inverted from the orientation of FIG. 17, and being attached to carrier 260 such that devices 264, 270, and 266 are within opening 240 and devices 262 and 268 are spaced outside the perimeter of SwC structure 250. In the illustrated embodiment, device 270 is thicker than devices 264 and 266 but not so thick as to extend to wirebonds 244 and 246.

Figure 20:
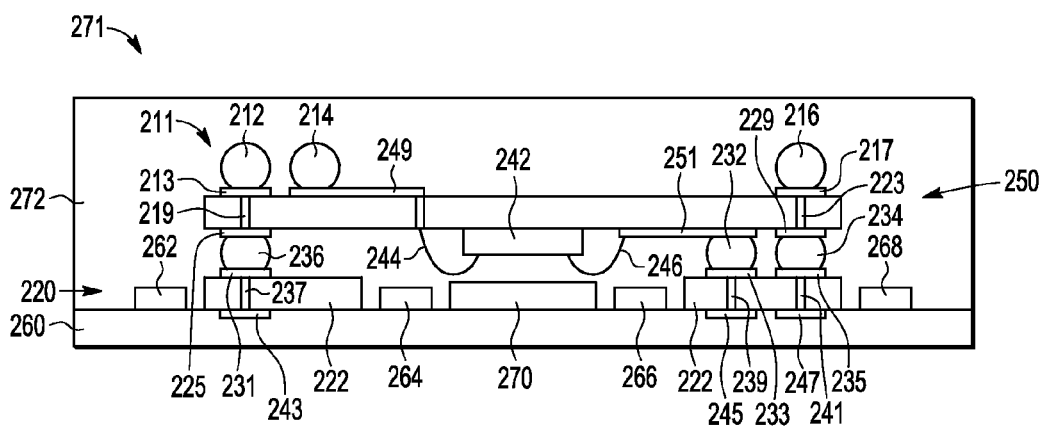

Shown in FIG. 20 is intermediate structure 271 after applying an encapsulant 272 that covers the top surface of carrier 260 and thus covers SwC structure 250, device 262, and device 268. Encapsulant 272 also fills in the space in and around devices 264, 270, 266, and 242.

Figure 21:
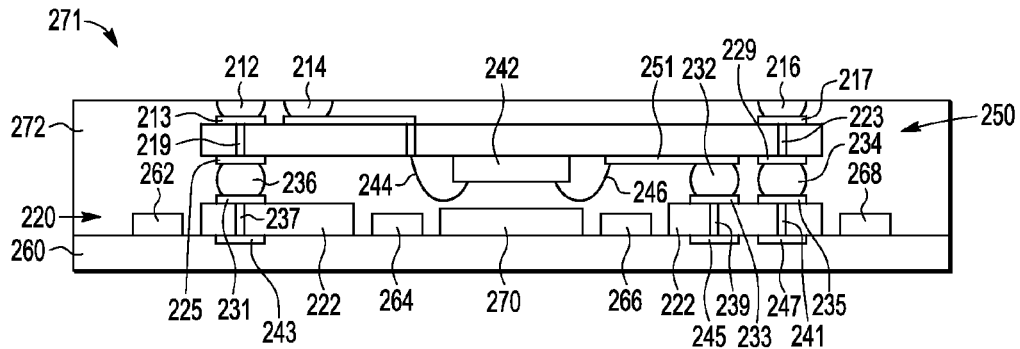

Shown in FIG. 21 is intermediate structure 271 after grinding back encapsulant 272 and stopping after exposing interconnects 212, 214, and 216. The grinding also partially grinds back the interconnects 212, 214, and 216.

Figure 22:
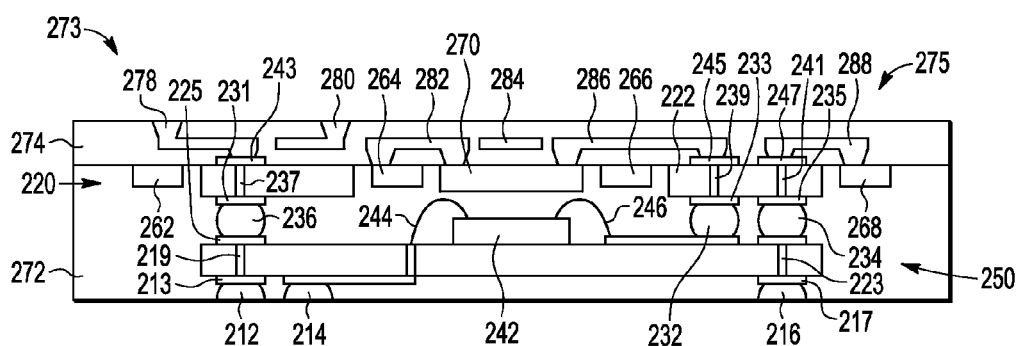

Shown in FIG. 22 is a FO-WLP 273 arising from removing carrier 260 and forming an interconnect layer 275 where carrier 260 had been present on SwC structure 250 as shown in FIG. 21. SwC 250 is shown inverted from the orientation of FIG. 21. Interconnect layer 275 has one or more dielectric layers 274, which have a first major surface, which may be referenced as an internal surface, contacting the surface of SwC structure 250 where devices 262, 264, 266, 268, and 270 are present. Devices 262, 264, 266, 268, and 270 each may have contact pads that contact the internal surface of the interconnect layer 275, or more particularly conductive structures (described below) within the interconnect layer 275. Interconnect layer 275 also has another major surface, which may be referenced as an external surface, opposite the internal surface. Interconnect layer 275 further has interconnects, such as interconnects 278, 280, 282, 284, 286, and 288, formed from portions of one or more conductive layers that are embedded in dielectric layer(s) 274. The interconnects are for connecting to the vias, the devices, and the external surface of interconnect layer 275. Although only one interconnect layer is shown, there may be a number of interconnect layers within dielectric layer(s) 274.

Figure 23:
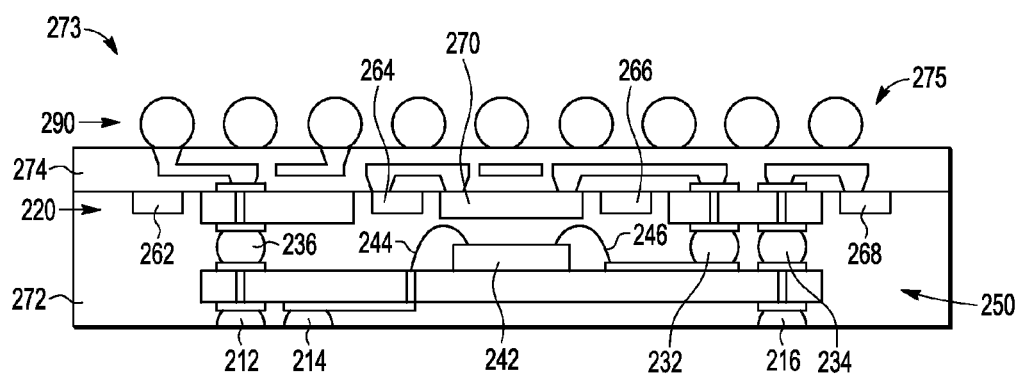

Shown in FIG. 23 is FO-WLP 273 after forming a plurality of solder balls 290 on the external surface of interconnect layer 275. The solder balls provide a highly usable external electrical connection to devices 262, 264, 266, 268, and 270. In a typical application, all or nearly all of the solder balls would be electrically connected to an interconnect. At this stage, packaging may be considered complete so that the FO-WLP 273 is ready for assembly to a printed circuit board. FO-WLP 273 includes two planes of microelectronic devices, with the first plane including device 224, and the second plane including devices 262, 264, 266, 268, 270.

Figure 24:
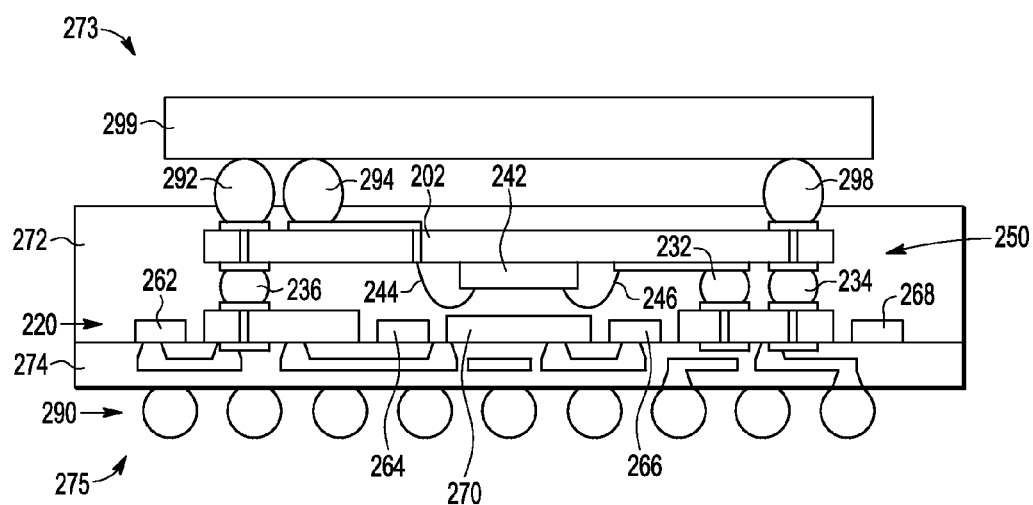

Shown in FIG. 24 is FO-WLP 273, inverted from the orientation of FIG. 23, after forming additional solder interconnects 292, 294, and 298 using previously ground interconnects 212, 214, and 216, respectively. In addition, an additional packaged or unpackaged electronic device 299, which may include an integrated circuit and/or other electronic components, is attached to solder interconnects 292, 294, and 298. Device 299 may be considered to be a third plane of devices.

Figure 25:
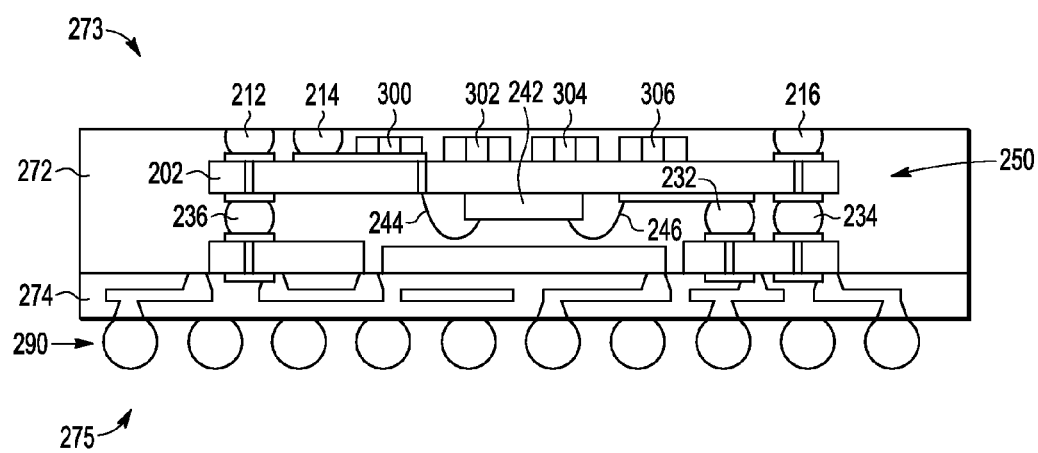
FIG. 25 is a cross section of another embodiment of a structure resulting from using a method similar to that shown in FIGS. 14-24.

Shown in FIG. 25 is a variation from FIG. 24 in that FO-WLP 273 of FIG. 23 has additional devices 300, 302, 304, and 306 mounted on the surface of substrate 202 opposite the side on which device 242 is mounted. Devices 300, 302, 304, and 306 are surface mounted devices, in an embodiment.

Figure 26:
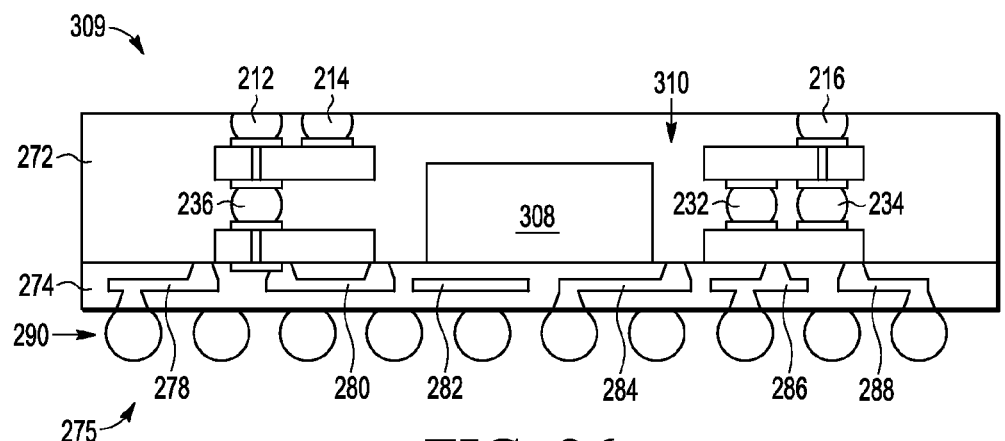
FIG. 26 is a cross section of yet another embodiment of a structure resulting from using a method similar to that shown in FIGS. 14-24.
Figure 27:
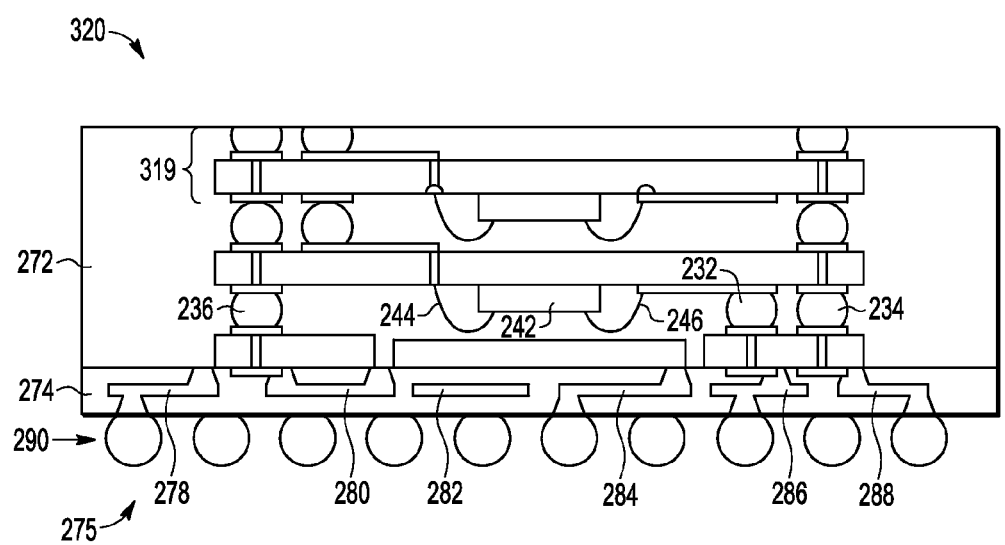
FIG. 27 is a cross section of yet another embodiment of a structure resulting from using a method similar to that shown in FIGS. 14-24.
Figure 28:
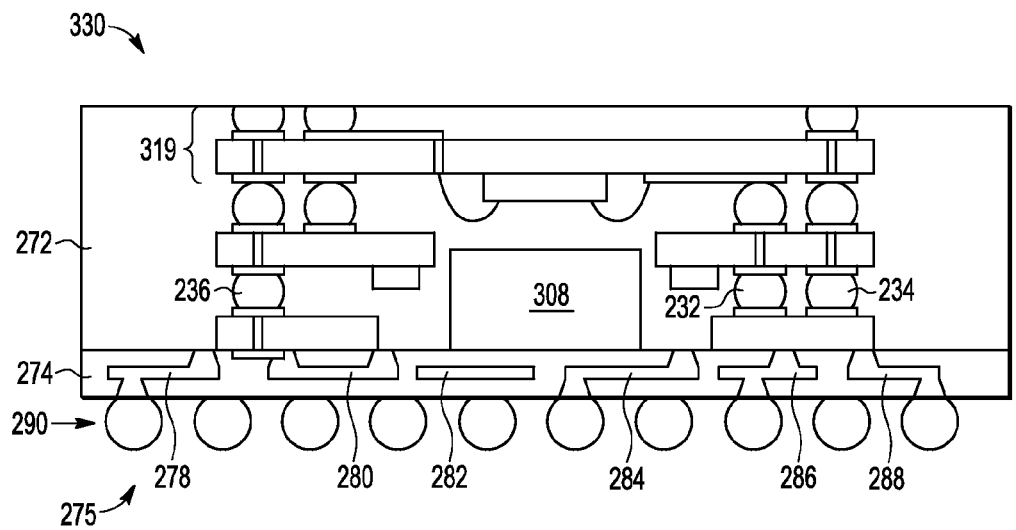
FIG. 28 is a cross section of yet another embodiment of a structure resulting from using a method similar to that shown in FIGS. 14-24.

Shown in FIGS. 26-28 are FO-WLPs 309, 320, and 330 as variations on FO-WLP 273. In the case of FO-WLP 309, an opening 310 is sufficient to accommodate a device 308 having a height that is sufficient to cause device 308 to extend into opening 310. In the case of FO-WLP 320, an additional structure 319, similar to the one immediately below it, demonstrates that additional stacking of structures can be achieved. FO-WLP 330 includes a combination of a device 308 with a height that is sufficient to cause device 308 to extend into opening 310, and additional structure 319.

Figure 29:
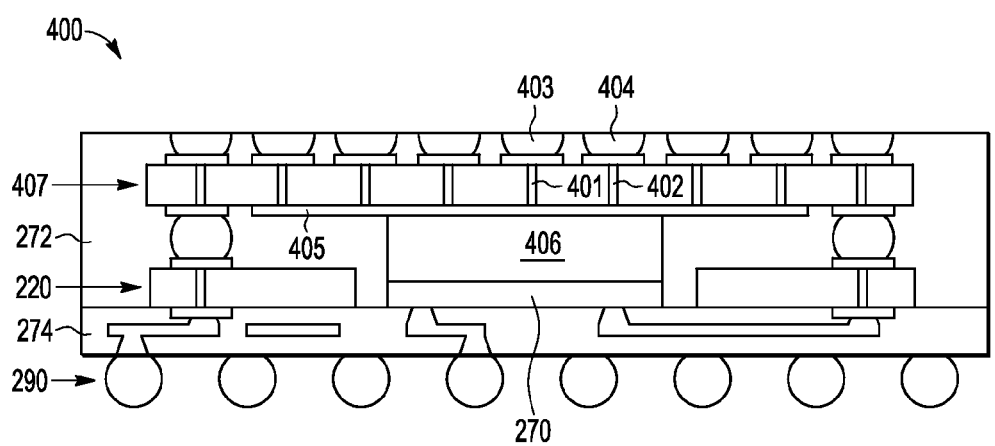
FIG. 29 is a cross section of yet another embodiment of a structure resulting from using a method similar to that shown in FIGS. 14-24.

Shown in FIG. 29 is a FO-WLP 400 having a heat spreader 406, which may be copper or another suitable material, on device 270; a conductive pad 405 on and extending past heat spreader 406; a carrier 407 on and extending past conductive pad 405; conductive vias, such as vias 401 and 402, through carrier 407; and conductive interconnects, such as solder balls 403 and 404, coupled to the vias. Vias, such as vias 401 and 402, which contact conductive pad 405, may be used for additional heat spreading. Other vias outside conductive pad 405 may be used, for example, to convey signals, power, and a ground reference, for example.

Thus it is seen that the use of a SwC structure as part of a FO-WLP can be effective in achieving higher device density, for a given device footprint size, by enabling the device to include multiple planes of microelectronic devices. A cavity, as shown in FIGS. 1-14, or something similar, such as an opening, as shown in FIGS. 14-29, is effective in enabling device planes to be arranged in a manner in which allows for higher device density.

By now it is apparent there has been disclosed a packaged semiconductor structure having an interconnect layer. The packaged semiconductor structure further includes a first microelectronic device on a first major surface of the interconnect layer. The packaged semiconductor structure further includes a substrate having a cavity, wherein the cavity is defined by a vertical portion and a horizontal portion, wherein the vertical portion surrounds the first microelectronic device, the horizontal portion is over the first microelectronic device, and the first microelectronic device is between the horizontal portion and the first major surface of the interconnect layer such that the first device is in the cavity. The packaged semiconductor structure further includes a second microelectronic device attached to the horizontal portion of the substrate. The packaged semiconductor structure further includes an encapsulant on the interconnect layer and surrounding the first microelectronic device, the substrate, and the second microelectronic device, such that the substrate is embedded in the encapsulant. The packaged semiconductor structure may have a further characterization by which the second microelectronic device is in the cavity. The packaged semiconductor structure may have a further characterization by which the horizontal portion is between the first microelectronic device and the second microelectronic device. The packaged semiconductor structure may have a further characterization by which the horizontal portion has an opening. The packaged semiconductor structure may have a further characterization by which the second microelectronic device is on the horizontal portion adjacent the opening. The packaged semiconductor structure may have a further characterization by which the substrate has a second cavity, wherein the second microelectronic device is in the second cavity and the horizontal portion is between the first cavity and the second cavity. The packaged semiconductor structure may have a further characterization by which the substrate includes a first interposer layer on the interconnect layer having an opening surrounding the first microelectronic device defining at least a portion of the cavity and a second interposer layer comprising the horizontal portion of the substrate. The packaged semiconductor structure may further include a plurality of conductive interconnects between the first interposer layer and the second interposer layer. The packaged semiconductor structure may further include a plurality of interconnects on the vertical portion of the substrate, wherein the encapsulant exposes a portion of each interconnect of the plurality of interconnects. The packaged semiconductor structure may further include a third microelectronic device attached to the portion of each interconnect. The packaged semiconductor structure may further include a second plurality of interconnects on a second major surface of the interconnect layer. The packaged semiconductor structure may further include a third microelectronic device, wherein the third microelectronic device is on an opposite surface of the horizontal portion than a surface to which the second microelectronic device is attached.

Disclosed also is a method for forming a packaged semiconductor structure. The method includes placing first microelectronic device on a carrier, wherein a first major surface of the first microelectronic device is in contact with the carrier. The method further includes placing a substrate having a cavity over the first microelectronic device, wherein the substrate has a vertical portion surrounding the first microelectronic device and a horizontal portion over the first microelectronic device and a second microelectronic device attached to the horizontal portion of the substrate. The method further includes forming an encapsulant over the substrate wherein the encapsulant surrounds the first microelectronic device, the second microelectronic device, and the substrate. The method further includes removing the carrier, wherein removing the carrier exposes the first major surface of the first microelectronic device and the vertical portion of the substrate. The method further includes forming an interconnect layer on the first major surface of the first microelectronic device, on the exposed vertical portion of the substrate and on a portion of the encapsulant. The method may have a further characterization by which, prior to placing the substrate over the first microelectronic device, the method comprises attaching the second microelectronic device to the horizontal portion of the substrate. The method may have a further characterization by which, prior to placing the substrate over the first microelectronic device, the method includes attaching the second microelectronic device to a first interposer layer of the substrate and attaching a second interposer layer of the substrate to the first interposer layer, wherein the second interposer layer has an opening which surrounds the second microelectronic device, and wherein the first interposer layer comprises the horizontal portion of the substrate. The method may further include, prior to forming the encapsulant, attaching a plurality of interconnects to the substrate, wherein the substrate is between the plurality of interconnects and the interconnect layer, wherein forming the encapsulant is performed such that the encapsulant is also formed over the plurality of interconnects and grinding the semiconductor structure to expose a portion of each of the plurality of interconnects. The method may further include attaching a third microelectronic device to the portion of each of the plurality of interconnects. The method may further include forming a second plurality of interconnects on the interconnect layer, wherein the interconnect layer is between the second plurality of interconnects and the encapsulant.

Also disclosed is a method for forming a packaged semiconductor structure. The method includes placing first microelectronic device on a carrier, wherein a first major surface of the first microelectronic device is in contact with the carrier. The method further includes placing a substrate having a first interposer layer attached to a second interposer layer on the carrier, each interposer layer having an opening which aligns to form a cavity, wherein the cavity surrounds the first microelectronic device, and wherein the first microelectronic device has a thickness greater than each of the first and second interposer layers. The method further includes forming an encapsulant over the substrate wherein the encapsulant surrounds the first microelectronic device and the substrate. The method further includes removing the carrier, wherein removing the carrier exposes the first major surface of the first microelectronic device and the first interposer layer of the substrate. The method further includes forming an interconnect layer on the first major surface of the first microelectronic device, on the first interposer layer of the substrate, and on a portion of the encapsulant. The method may further include, prior to forming the encapsulant, attaching a plurality of interconnects to the second interposer layer of the substrate, wherein the substrate is between the plurality of interconnects and the interconnect layer, wherein forming the encapsulant is performed such that the encapsulant is also formed over the plurality of interconnects, grinding the semiconductor structure to expose a portion of each of the plurality of interconnects, and forming a second plurality of conductive interconnects on the interconnect layer, wherein the interconnect layer is between the second plurality of interconnects and the encapsulant.

Although the subject matter is described herein with reference to specific embodiments, various modifications and changes can be made without departing from the scope of the present invention as set forth in the claims below, for example, the particular type of interconnect may be different. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method for forming a packaged semiconductor structure, comprising:

placing first microelectronic device on a carrier, wherein a first major surface of the first microelectronic device is in contact with the carrier;

placing a substrate having a cavity over the first microelectronic device, wherein the substrate has a vertical portion surrounding the first microelectronic device and a horizontal portion over the first microelectronic device and a second microelectronic device attached to the horizontal portion of the substrate;

forming an encapsulant over the substrate wherein the encapsulant surrounds the first microelectronic device, the second microelectronic device, and the substrate, wherein the encapsulant contacts the first electronic device and the second electronic device, wherein the forming the encapsulant includes flowing encapsulant into the cavity through an opening in the substrate to contact the first microelectronic device;

removing the carrier, wherein removing the carrier exposes the first major surface of the first microelectronic device and the vertical portion of the substrate; and forming an interconnect layer on the first major surface of the first microelectronic device, on the exposed vertical portion of the substrate and on a portion of the encapsulant.

2. The method of claim 1, wherein prior to placing the substrate over the first microelectronic device, the method comprises attaching the second microelectronic device to the horizontal portion of the substrate.

3. The method of claim 1, wherein prior to placing the substrate over the first microelectronic device, the method comprises:

attaching the second microelectronic device to a first interposer layer of the substrate; and attaching a second interposer layer of the substrate to the first interposer layer, wherein the second interposer layer has an opening which surrounds the second microelectronic device, and wherein the first interposer layer comprises the horizontal portion of the substrate.

4. The method of claim 1, further comprising:

prior to forming the encapsulant, attaching a plurality of interconnects to the substrate, wherein the substrate is between the plurality of interconnects and the interconnect layer, wherein forming the encapsulant is performed such that the encapsulant is also formed over the plurality of interconnects; and grinding the semiconductor structure to expose a portion of each of the plurality of interconnects.

5. The method of claim 4, further comprising:

attaching a third microelectronic device to the portion of each of the plurality of interconnects.

6. The method of claim 4, further comprising:

forming a second plurality of interconnects on the interconnect layer, wherein the interconnect layer is between the second plurality of interconnects and the encapsulant.

7. The method of claim 1 wherein the forming the encapsulant includes flowing encapsulant into the cavity through an opening in the substrate to contact the second microelectronic device.

* * * * *